(12) United States Patent
    Carreau

(10) Patent No.: US 7,843,373 B2
(45) Date of Patent: Nov. 30, 2010

(54) METHOD TO REDUCE ERROR IN TIME INTERLEAVED ANALOG-TO-DIGITAL CONVERTERS ARISING DUE TO APERTURE DELAY MISMATCH

(75) Inventor: Gary Carreau, Plaistow, NH (US)

(73) Assignee: Analog Devices, Inc., Norwood, MA (US)

( * ) Notice: Subject to any disclaimer, the term of this patent is extended or adjusted under 35 U.S.C. 154(b) by 23 days.

(21) Appl. No.: 12/394,135

(22) Filed: Feb. 27, 2009

(65) Prior Publication Data

US 2010/0220000 A1    Sep. 2, 2010

(51) Int. Cl.
    *H03M 1/12* (2006.01)
(52) U.S. Cl. .................. 341/155; 341/156; 341/172
(58) Field of Classification Search ............... 341/155, 341/172, 156, 161, 163
    See application file for complete search history.

(56) References Cited

U.S. PATENT DOCUMENTS

| | | | |
|---|---|---|---|
| 6,515,611 B1 * | 2/2003 | Fetterman et al. | 341/161 |
| 6,784,814 B1 | 8/2004 | Nair et al. | |
| 7,002,504 B2 * | 2/2006 | McMahill | 341/161 |
| 7,199,746 B1 * | 4/2007 | Chowdhury et al. | 341/172 |
| 7,233,276 B1 * | 6/2007 | Huang | 341/163 |
| 7,308,027 B1 | 12/2007 | Gaboriau et al. | |
| 2002/0039076 A1 * | 4/2002 | Soenen | 341/156 |
| 2006/0176197 A1 | 8/2006 | McNeill et al. | |
| 2006/0227025 A1 | 10/2006 | El-Sankary et al. | |
| 2007/0120725 A1 * | 5/2007 | Huang | 341/161 |
| 2008/0231489 A1 | 9/2008 | Moore et al. | |

OTHER PUBLICATIONS

PCT International Search Report and Written Opinion mailed on Apr. 12, 2010, from PCT/US10/23888.

* cited by examiner

*Primary Examiner*—Jean B Jeanglaude
(74) *Attorney, Agent, or Firm*—Kenyon & Kenyon LLP

(57) ABSTRACT

A system for randomizing aperture delay in a time interleaved ADC system that includes a plurality of selection switch stages corresponding to each of the ADCs in the system and a second selection switch stage coupled to a voltage source. A plurality of conductors extend between the second selection switch stage and each of the selection switch stages, in excess of the number of ADCs in the system. For each of N ADCs in the system, the selection switch stages and the second selection switch stage support at least N+1 selectable conductive paths extending from each of the sampling capacitors of the ADCs to the voltage source. Random selection of the N+1 paths can randomize aperture delay.

20 Claims, 4 Drawing Sheets

300

METHOD TO REDUCE ERROR IN TIME INTERLEAVED ANALOG-TO-DIGITAL CONVERTERS ARISING DUE TO APERTURE DELAY MISMATCH

BACKGROUND

Analog to digital converters (ADCS) are well known circuits that generate a digital codeword representing an analog signal. A variety of circuit schemes are known for ADCs including, for example, the successive approximation register ADC. Many analog to digital conversion processes involve multi-stage processes for example, to sample the analog signal, to sequentially test the analog voltage against various threshold voltages and to generate a digital codeword representing the value of the analog voltage. In a circuit with a single ADC, the circuit could not begin conversion of a new analog voltage while it is processing a current analog voltage. Thus, the processing time of an ADC can limit the rate at which a time varying analog signal can be sampled and converted to digital codewords.

A common technique to increase the rate of analog to digital conversion is to provide multiple ADCs in a circuit system and to employ them on a time-interleaved basis. During a time in which a first ADC is processing a first sample of an analog signal, other ADCs may take other samples of the analog signal and process them. The multi-ADC system, therefore, generates digital codewords at higher rates that a single ADC system. However, several error sources can arise from mismatch between the individual ADC's. Common error sources include offset, gain, linearity, and aperture delay. Various calibration techniques have been used to address offset, gain, and linearity errors, but aperture delay mismatch remains a difficult problem.

FIG. 1 illustrates a example of aperture delay mismatch that may occur in a multi-ADC system. Aperture delay mismatch can cause a delay in the times at which an ADC samples an input signal. In a multi-ADC system, aperture delay mismatch can cause one ADC circuit to sample an input signal at a time that is delayed from an ideal sample time by a certain offset time. The example of FIG. 1, illustrates an exemplary input signal IN which is to be sampled by four ADCs at regular intervals. An ADC2 may sample at a time that is offset from the idea by an aperture delay $\Delta t$. Thus, samples taken by ADC may include sampling errors that appear as systematic errors in the codewords output by the circuit system.

FIG. 2 illustrates simulation of an FFT taken of an input sine wave such as the IN signal of FIG. 1. Ideally, coding errors would be distributed randomly among all frequencies. Due to aperture delay mismatch among the ADCs, coding errors may be concentrated at certain frequency tones, which can create the systematic errors in the output signal.

No known circuit system adequately protects against aperture delay mismatch in a multi-ADC system. Prior attempts to solve systematic aperture delay artifacts have been attempted but they can be disadvantageous because they add other distortion to an output signal or they are prohibitively expensive by adding a large number of circuit components. Accordingly, there is a need in the art for a multi-ADC system with increased immunity to aperture delay mismatch.

DETAILED DESCRIPTION

Embodiments of the present invention provide a system for randomizing aperture delay in a time interleaved ADC system that includes a plurality of selection switch stages corresponding to each of the ADCs in the system and a second selection switch stage coupled to a voltage source. A plurality of conductors extend between the second selection switch stage and each of the selection switch stages, in excess of the number of ADCs in the system. For each of, say, N ADCs in the system, the selection switch stages and the second selection switch stage support at least N+1 selectable conductive paths extending from each of the sampling capacitors of the ADCs to the voltage source. Random selection of the N+1 paths can randomize aperture delay.

Figure 1:
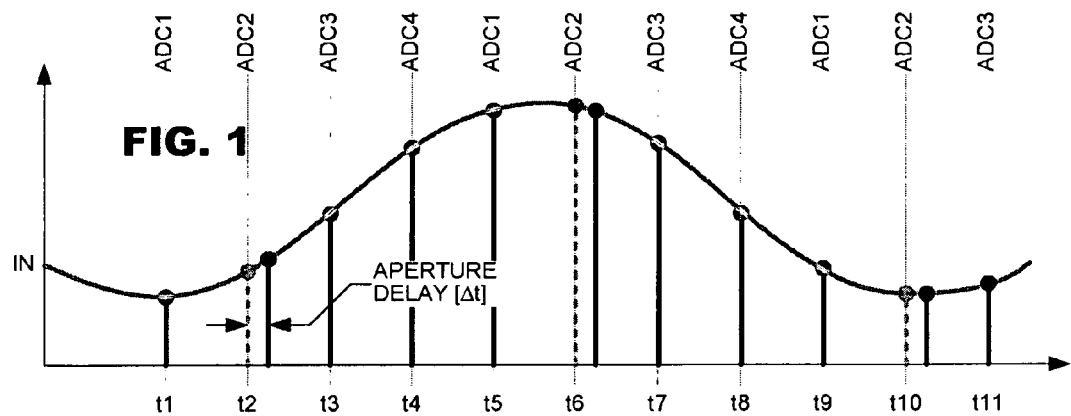
FIG. 1 is a graph illustrating an example of aperture delay mismatch.
Figure 2:
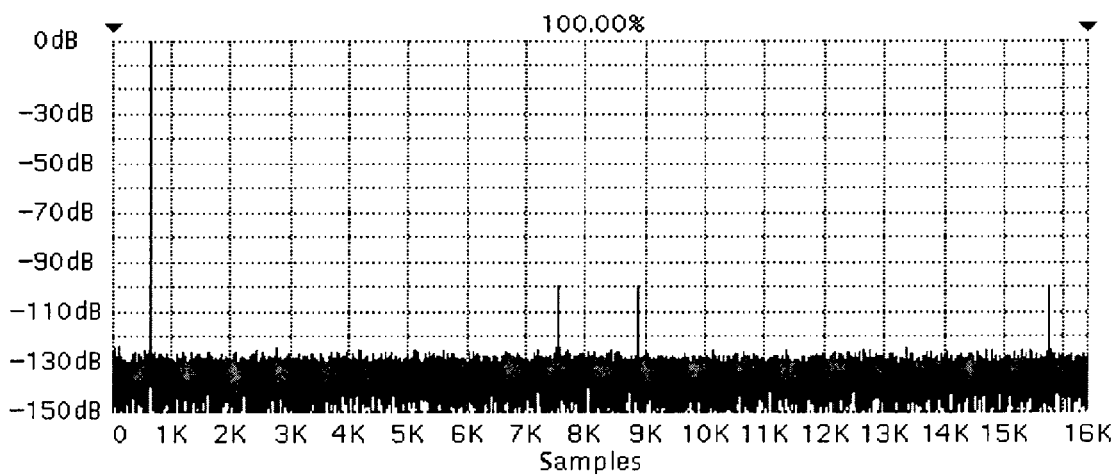
FIG. 2 is a graph illustrating exemplary distortion that can arise due to aperture delay mismatch.
Figure 3:
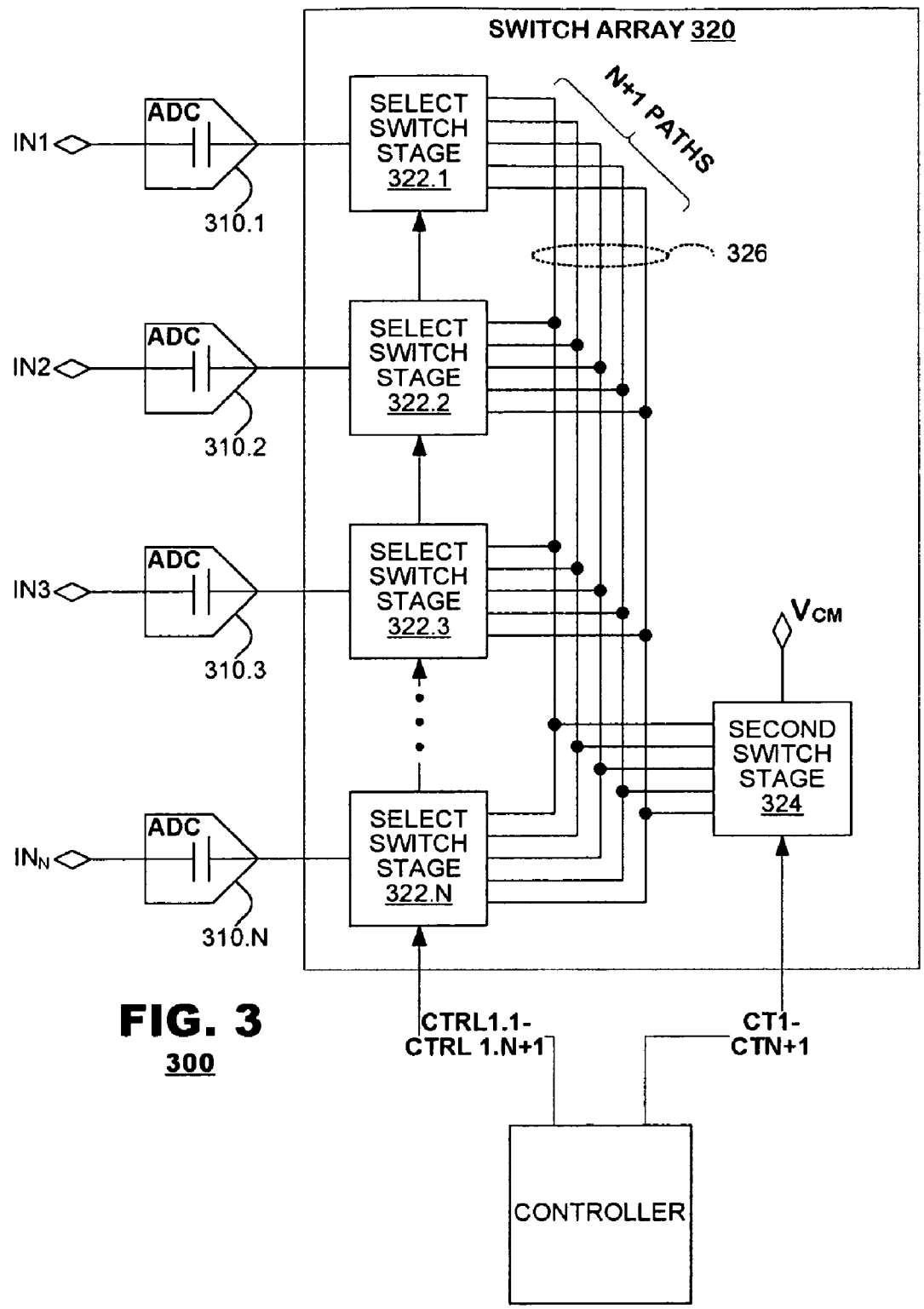
FIG. 3 is a block diagram of a system according to an embodiment of the present invention.

FIG. 3 is a block diagram of a switching system 300 for use with a plurality of time-interleaved ADCs 310.1-310.N. The system 300 may include a switch array 320 that provides a plurality of connection paths between a first plate of a sampling capacitor within each ADC 310.1-310.N and a source voltage ($V_{CM}$). A common input voltage is connected to a second plate of the sampling capacitor within each ADC 310.1-310.N. The ADCs may operate on a time-interleaved basis to sample the input voltage during an acquisition phase and thereafter generate a digital codeword from the sampled voltage during a conversion phase. To simplify presentation herein, the internal structure of the ADCs are omitted, except to show the sampling capacitor to which the switch array 320 is connected. This principles of the present invention may find application in charge-based ADCs and, further, to other types of ADC where an input voltage is sampled at a capacitor and held for conversion by an ADC.

The switch array 320 may include a plurality of first switch stages 322.1-322.N, called "selection switch stages" herein, coupled to the ADCs 310.1-310.N. One selection switch stage may be provided for each of the ADCs. The switch array 320 also may include a second switch stage 324 coupled to the selection switch stage and to the source voltage $V_{CM}$. The switch array 320 may include a plurality of conductive paths 326 connecting each of the selection switch stages 322.1-322.N to the second switch stage 324. According to an embodiment of the present invention, a system 300 having N ADCs may include at least N+1 conductive paths 326. Thus, the system 300 provides N+1 conductive paths 326 between the source voltage $V_{CM}$ and each of the top plates of the ADC sampling capacitors.

The system 300 operates in a pipelined fashion in which each ADC 310.1-310.N samples the input voltages and converts the sampled voltage to a corresponding digital word. During operation, in an acquisition phase, the source voltage $V_{CM}$ is coupled to the sampling capacitor top plate of a first ADC (say, ADC 310.1) via a randomly selected path 326. The input voltage is applied to the sampling capacitor's bottom plate during the acquisition phase. After the acquisition phase concludes, the connection between the source voltage $V_{CM}$ and the top plate is broken, which traps charge on the top plate. The ADC 310.1 thereafter enters a conversion phase during which the sampled input voltage is converted to a digital codeword.

During a next conversion interval, the first ADC may return to the acquisition phase. The top plate of the sampling capacitor may be coupled to the source voltage $V_{CM}$ through a randomly selected path 326 and the bottom plate of the sampling capacitor may be coupled to the input voltage. Thus, over time, a single ADC 310.1 iteratively repeats acquisition and conversion using randomly-selected conduction paths 326 of the switch array 320.

While the first ADC 310.1 operates in the conversion phase, other ADCs 310.2-310.N may enter the acquisition phase on a time ordered basis. During their respective acquisition phases, the source voltage $V_{CM}$ is coupled to the sampling capacitor top plates of the other ADCs 310.2-310.N via a randomly selected path 326. The input signal also is sampled on the bottom plates of the respective ADC's sampling capacitors. Over time, any aperture delay effects caused by component mismatch of the ADC selection switches 322.1-322.N may be randomized due to the randomized conduction paths 326 that extend from the selection switches 322.1-322.N to the source voltage $V_{CM}$. Whereas aperture delay mismatch formerly caused observable systematic noise effects, the embodiment of FIG. 3 causes aperture delay mismatch effects to appear as white noise.

Figure 4:
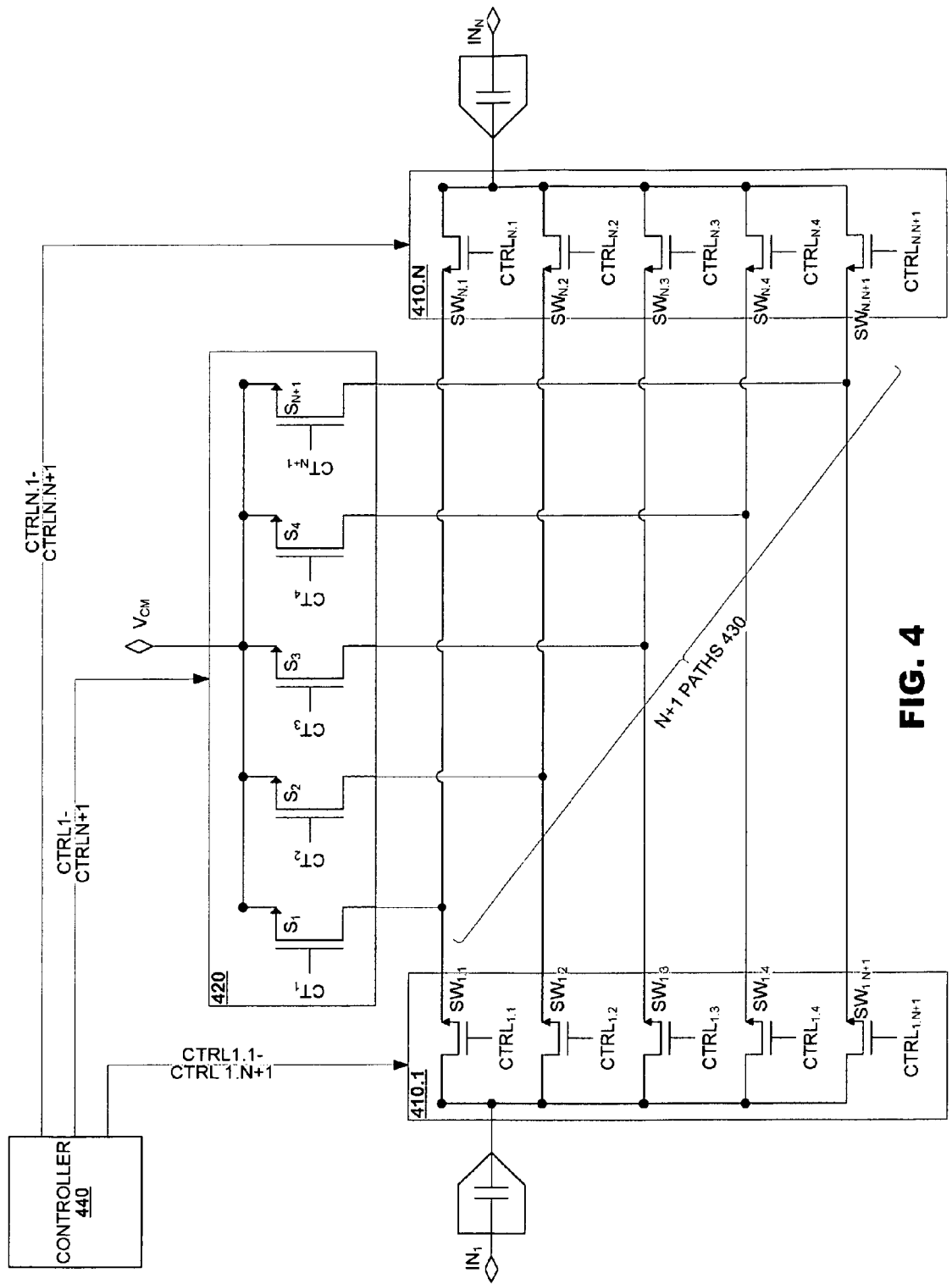
FIG. 4 is a simplified circuit diagram of a system according to an embodiment of the present invention.

FIG. 4 is a simplified diagram showing a switching configuration of a system 400 according to an embodiment of the present invention. There, the system 400 may have N selection switch stages 410.1-410.N (only two of which are shown in FIG. 4) coupled to a second switch stage 420 via at least N+1 conductive paths 430. Each of the switch stages 410.1-410.N and 420 may include a corresponding number of switches (e.g., at least N+1), which are selectively controlled by a controller 440 to coupled and disconnect the sampling capacitors to and from the source voltage $V_{CM}$.

The switches of the selection switch stages (say, switches $SW_{1.1}$-$SW_{1.N+1}$ of the first stage 410.1) each may be coupled to a respective conductor 430 in a one-to-one fashion. The switches $SW_{1.1}$-$SW_{1.N+1}$ also may be coupled to the sampling capacitor of a respective ADC in a many-to-one fashion. The switches $S_1$-$S_{N+1}$ of the second switch stage 420 each may be coupled to a respective conductor 430 in a one-to-one fashion and may be coupled to the source voltage in a many-to-one fashion. Thus, a single switch $S_1$ from the second switch stage 420 may be coupled via a respective conductor 430 to one switch from each of the selection switch stages 410.1-410.N, switches $S_{i.1}$ (i=1 to N+1).

In an embodiment, the controller 440 may be state machine that operates according to a predetermined control algorithm. The controller 440 may manage the switches of the selection switch stages 410.1-410.N and the second switch stage 420 to randomize utilization of conductors 430 as each ADC enters its acquisition phase. The controller 440 may operate according to various randomization algorithms as may be convenient, including algorithms that select conductors pseudo-randomly.

Figure 5:
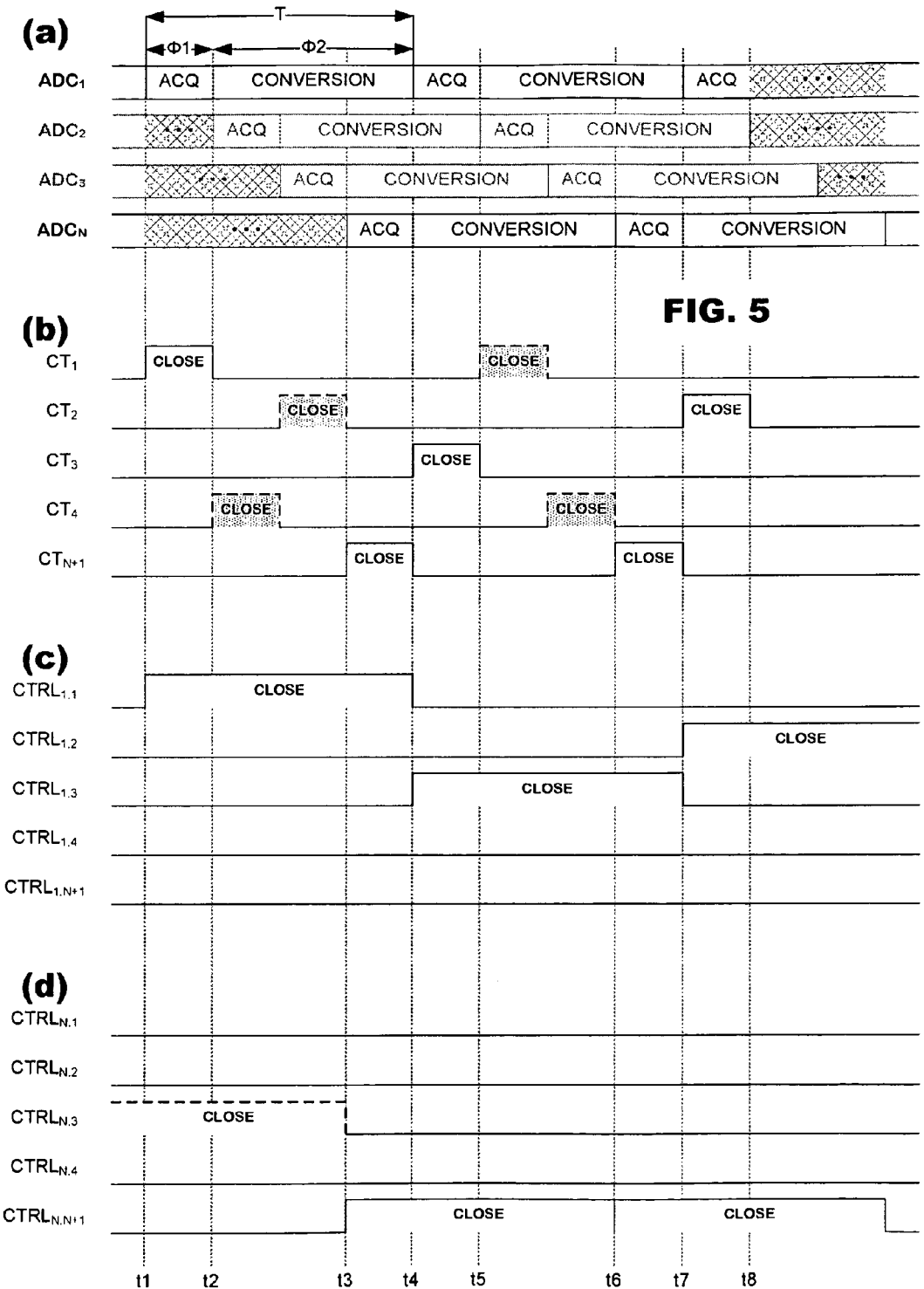
FIG. 5 is a timing diagram of a system according to the embodiment of FIG. 4.

FIG. 5 is a simplified timing diagram showing operation of a system according to an embodiment of the present invention. Graph (a) of FIG. 5 illustrates pipelined operation of four ADCs, operating according to an acquisition phase and a conversion phase. Graphs (b)-(d) illustrate exemplary switching operations that may occur in the selection switch stages and the second switch stage of an ADC system. For convenience, as in the example of FIG. 4, FIG. 5 illustrates switching operations for only a pair of selection switch stages. Graph (c), therefore, illustrates switching operations that may occur in a first ADC—ADC$_1$ of graph 5 (a) —and graph (d) illustrates switching operations that may occur in a second ADC—ADC$_N$ of graph 5 (a). Graph (b) illustrates switching operations that may occur in a second switch stage and are associated with the switching operations of graphs (c) and (d). Additional switching operations are shown in graph 5(b) in phantom associated with operations of ADC2 and ADC3.

At time t1, FIG. 5 illustrates ADC1 entering an acquisition phase. As discussed, a controller may randomly select a conductive path extending between the sampling capacitor of ADC$_1$ and the voltage source $V_{CM}$ (FIG. 4). The controller may assert control signals to a pair of switches associated with the selected conductor. In the example of FIG. 5, control signals $CT_1$ and $CTRL_{1.1}$ are shown as asserted, which correspond to switches $S_1$ and $SW_{1.1}$ of FIG. 4 and cause those switches to close. The control signals may remain asserted until the conclusion of the acquisition phase at time $t_2$.

At time $t_2$, when ADC$_1$ enters the conversion phase, the controller may de-assert the control signal $CT_1$ to switch $S_1$ in the second switch stage. Charge accumulated on the top plate of the sampling capacitor in ADC$_1$ may be captured on the plate. The selected switch $SW_{1.1}$ of the selection switch stage may remain closed until the end of the conversion phase at time $t_4$.

At time $t_3$, before conclusion of the conversion phase of ADC$_1$, ADC$_N$ may enter the acquisition phase. The controller may randomly select a conductive path extending between the sampling capacitor of ADC$_N$ and the voltage source $V_{CM}$. The controller may assert control signals to a pair of switches associated with the selected conductor—in this example, control signals $CT_{N+1}$ and $CTRL_{N.N+1}$ may be asserted, which correspond to switches $S_{N+1}$ and $SW_{N.N+1}$ The switches may close in response to the asserted control signals. The control signals may remain asserted until the conclusion of the acquisition phase at time $t_4$. At time $t_4$, when ADC$_N$ enters the conversion phase, the controller may de-assert the control signal $CT_N$ to switch $S_N$ in the second switch stage, trapping accumulated charge on the sampling capacitor of ADC$_N$. In this manner, operation of ADC$_N$ mimics operation of ADC$_1$ but is staggered in time.

FIG. 5 illustrates waveforms that cause randomization of conductive paths between the source voltage $V_{CM}$ and the sampling capacitors of the respective ADCs. When ADC$_1$ returns to the acquisition phase at time $t_4$, FIG. 5 illustrates control signals $CT_3$ and $CTRL_{1.3}$ being asserted, which select a different conductive paths than was selected at time t1. FIG. 5 shows ADC$_1$ returning to the acquisition phase at time t7, at which time control signals $CT_2$ and $CTRL_{1.2}$ are asserted. Similarly, FIG. 5 illustrates ADC$_N$ returning to the acquisition phase at time $t_6$ at which time control signals $CT_{N+1}$ and $CTRL_{N.N+1}$ are shown as asserted. The randomization algorithm permits selection switches to be reused from a first conversion operation to a subsequent operation as part of the mismatch randomization process. Thus, the controller controls switch operations in both the selection switch stages 410.1-410.N and the second switch stage 420 (FIG. 4) to randomize utilization of components and randomize aperture delay.

Graph (b) illustrates control operations associated with all ADCs in the example of FIG. 5—ADC1 and ADCN. Thus, graph (b) illustrates control signals applied to switches CT1-CTN+1 that are associated with the acquisition phases of those ADCs, both between times t2-t3 and times t5-t6. FIG. 5 does not include graphs of the counterpart selection switches corresponding to graphs (c) and (d) merely to simplify presentation of FIG. 5.

Several embodiments of the present invention are specifically illustrated and described herein. However, it will be appreciated that modifications and variations of the present invention are covered by the above teachings and within the purview of the appended claims without departing from the spirit and intended scope of the invention. For example, while the foregoing discussion has presented embodiments having N+1 conductive paths provided for an system having N ADCs, the number of conductive paths may be expanded to a greater number as may be desired (e.g., N+2 or greater). Expanding the number of conductive paths may contribute to further randomization of aperture delay mismatch effects, albeit at the cost of greater area consumption when the system is manufactured as an integrated circuit.

Several embodiments of the present invention are specifically illustrated and described herein. However, it will be appreciated that modifications and variations of the present invention are covered by the above teachings and within the purview of the appended claims without departing from the spirit and intended scope of the invention.

I claim:

1. A control system for a time interleaved analog to digital converter (ADC) system comprising:
    a plurality of selection switch stages, one corresponding to each ADC in the system and coupled to a respective sampling capacitor thereof;
    a second switch stage coupled to a voltage source;
    a plurality of conductors extending between the second switch stage and each of the selection switch stages,
    wherein for each of N ADCs in the system, the selection switch stages and the second switch stage support at least N+1 selectable conductive paths extending from each of the sampling capacitors of the ADCs to the voltage source.

2. The control system of claim 1, wherein signal acquisition in each ADC includes random selection of the conductive paths to randomize aperture delay in the ADCs.

3. The control system of claim 1, further comprising a controller to randomly select one of the conductive paths during each iteration of conversion of a respective ADC.

4. The control system of claim 3, wherein the random path selection is a pseudo-random selection.

5. The control system of claim 3, wherein the random path selection selects randomly from among unused conductive paths.

6. The control system of claim 1, wherein the control system includes exactly N+1 selectable conductive paths.

7. The control system of claim 1, wherein the control system includes more than N+1 selectable conductive paths.

8. The control system of claim 1, wherein the ADCs are successive approximation register analog to digital converters.

9. An analog to digital converter (ADC) system comprising:
    N ADCs for time interleaved analog to digital conversion of an input signal,
    N selection switch stages, one corresponding to each ADC in the system and coupled to a respective sampling capacitor thereof;
    a second switch stage coupled to a voltage source;
    at least N+1 conductors extending between the second switch stage and each of the selection switch stages.

10. The ADC system of claim 9, wherein signal acquisition in each ADC includes random selection of the conductive paths to randomize aperture delay in the ADCs.

11. The ADC system of claim 9, further comprising a control means to connect an ADC to the voltage source via a randomly selected conductor via control of a respective selection switch stage and the second switch stage.

12. The ADC system of claim 11, wherein the random conductor selection is a pseudo-random selection.

13. The ADC system of claim 11, wherein the random conductor selection selects randomly from among unused conductor.

14. The ADC system of claim 9, wherein the ADC system includes exactly N+1 selectable conductive paths.

15. The ADC system of claim 9, wherein the ADC system includes more than N+1 selectable conductive paths.

16. The ADC system of claim 9, wherein the ADCs are successive approximation register analog to digital converters.

17. An aperture mismatch control method in time-interleaved integrated circuit system, comprising:
    sampling an input voltage on a time-interleaved basis at a plurality of sampling capacitors,
    while each respective capacitor is sampling the input voltage at a first plate thereof, connecting a second plate of the respective capacitor to a reference potential,
    wherein the connecting occurs through a randomly-selected one of a plurality of electrical paths between the second plate and the reference potential.

18. The method of claim 17, wherein for N sampling capacitors, there are N+1 electrical paths.

19. The method of claim 17, wherein for N sampling capacitors, there are more than N+1 electrical paths.

20. The method of claim 17, wherein the randomly-selected path is selected via a pseudo-random selection algorithm.

* * * * *